(12) United States Patent
Rothkopf et al.

(10) Patent No.: US 8,634,204 B2
(45) Date of Patent: Jan. 21, 2014

(54) COMPACT FOLDED CONFIGURATION FOR INTEGRATED CIRCUIT PACKAGING

(75) Inventors: Fletcher R. Rothkopf, Los Altos, CA (US); Phillip M. Hobson, Menlo Park, CA (US); Adam Mittleman, San Francisco, CA (US); Anna-Katrina Shedletsky, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 471 days.

(21) Appl. No.: 12/859,694

(22) Filed: Aug. 19, 2010

(65) Prior Publication Data

US 2012/0044636 A1  Feb. 23, 2012

(51) Int. Cl.
*H01R 12/16* (2006.01)

(52) U.S. Cl.
USPC .......... 361/789; 361/749; 361/803; 361/816; 174/254; 174/258

(58) Field of Classification Search
USPC .......... 174/254–260; 361/749, 803, 782–784, 361/816, 818
See application file for complete search history.

(56) References Cited

U.S. PATENT DOCUMENTS

| | | | |
|---|---|---|---|
| 4,074,419 A | 2/1978 | Hanni et al. | |
| 5,045,971 A | 9/1991 | Ono et al. | |
| 5,128,829 A | 7/1992 | Loew | |
| 5,180,644 A | 1/1993 | Bresin et al. | |
| 5,468,947 A | 11/1995 | Danielson et al. | |
| 5,568,358 A | 10/1996 | Nelson et al. | |
| 5,737,183 A | 4/1998 | Kobayashi et al. | |
| 5,784,256 A | 7/1998 | Nakamura et al. | |
| 5,796,575 A | 8/1998 | Podwalny et al. | |
| 6,038,328 A | 3/2000 | Hsu | |
| 6,121,676 A * | 9/2000 | Solberg | 257/686 |
| 6,137,890 A | 10/2000 | Markow | |
| 6,144,368 A | 11/2000 | Ooka et al. | |
| 6,153,834 A | 11/2000 | Cole et al. | |
| 6,172,418 B1 * | 1/2001 | Iwase | 257/723 |
| 6,208,521 B1 * | 3/2001 | Nakatsuka | 361/749 |

(Continued)

FOREIGN PATENT DOCUMENTS

| | | |
|---|---|---|
| CN | 2757458 | 2/2002 |
| CN | 1361970 | 7/2002 |

(Continued)

OTHER PUBLICATIONS

Evaluation Report to ZL2009201775365 dated May 28, 2010.

(Continued)

*Primary Examiner* — Tuan T Dinh
(74) *Attorney, Agent, or Firm* — Jennifer Luh (57) ABSTRACT

A memory unit for a computing device is described. The memory device can include a number of memory chips, such as flash nand chips, linked together via a flexible circuit connector. During installation of the memory device, portions of the flexible circuit connector can be bent or folded in different locations to allow an orientation of the memory chips to be changed relative to one another. In one embodiment, a memory device with a number of chips can be provided in a flat configuration and then can be folded to allow the chips to be installed in a stacked configuration. In another embodiment, the flexible circuit connector can be grounded to other conductive components to allow the flexible circuit connector to be used as part of a faraday cage surrounding the memory chips.

14 Claims, 9 Drawing Sheets

(56) References Cited

U.S. PATENT DOCUMENTS

| | | |
|---|---|---|
| 6,408,171 B1 | 6/2002 | Schuelke et al. |
| 6,427,017 B1 | 7/2002 | Toki |
| 6,452,811 B1 | 9/2002 | Tracy et al. |
| 6,536,589 B2 | 3/2003 | Chang |
| 6,746,797 B2 | 6/2004 | Benson et al. |
| 6,757,157 B2 | 6/2004 | Lammintaus et al. |
| 6,781,824 B2 | 8/2004 | Krieger et al. |
| 6,819,946 B2 | 11/2004 | Hansson |
| 6,838,810 B1 | 1/2005 | Bovio et al. |
| 6,847,522 B2 | 1/2005 | Fan et al. |
| 6,929,879 B2 | 8/2005 | Yamazaki |
| 7,149,557 B2 | 12/2006 | Chadha |
| 7,190,802 B2 | 3/2007 | Rains et al. |
| 7,236,357 B2 | 6/2007 | Chen |
| 7,297,439 B2 | 11/2007 | Yamazaki et al. |
| 7,352,584 B1 | 4/2008 | Sung |
| 7,412,267 B2 | 8/2008 | Eaton et al. |
| 7,432,860 B2 | 10/2008 | Huynh |
| 7,515,431 B1 | 4/2009 | Zadesky et al. |
| 7,553,055 B2 | 6/2009 | Liu |
| 7,558,054 B1 | 7/2009 | Prest et al. |
| 7,558,057 B1 | 7/2009 | Naksen et al. |
| 7,558,396 B2 | 7/2009 | Liu et al. |
| 7,564,424 B2 | 7/2009 | Umehara |
| 7,583,987 B2 | 9/2009 | Park |
| 7,620,175 B2 | 11/2009 | Black et al. |
| 7,663,607 B2 | 2/2010 | Hotelling et al. |
| 7,668,332 B2 | 2/2010 | Williams et al. |
| 7,688,574 B2 | 3/2010 | Zadesky et al. |
| 7,697,281 B2 | 4/2010 | Dabov et al. |
| 2002/0102870 A1 | 8/2002 | Burns et al. |
| 2002/0107044 A1 | 8/2002 | Kuwata et al. |
| 2002/0114143 A1 | 8/2002 | Morrison et al. |
| 2003/0003945 A1 | 1/2003 | Saiki et al. |
| 2003/0081392 A1 | 5/2003 | Cady et al. |
| 2004/0084244 A1 | 5/2004 | Zurek et al. |
| 2004/0203518 A1 | 10/2004 | Zheng et al. |
| 2005/0014537 A1 | 1/2005 | Gammon et al. |
| 2005/0088778 A1 | 4/2005 | Chen et al. |
| 2005/0095745 A1 | 5/2005 | Sapir |
| 2006/0157842 A1 | 7/2006 | Goodwin |
| 2006/0262500 A1 | 11/2006 | Huang et al. |
| 2007/0058821 A1 | 3/2007 | Welsh et al. |
| 2007/0081303 A1 | 4/2007 | Lam et al. |
| 2007/0160228 A1 | 7/2007 | Yang et al. |
| 2008/0025547 A1 | 1/2008 | Yun et al. |
| 2008/0037765 A1 | 2/2008 | Finney et al. |
| 2008/0037770 A1 | 2/2008 | Emmert |
| 2008/0062660 A1 | 3/2008 | Weber et al. |
| 2008/0069384 A1 | 3/2008 | Kim et al. |
| 2008/0165139 A1 | 7/2008 | Hotelling et al. |
| 2008/0165485 A1 | 7/2008 | Zadesky et al. |
| 2008/0166004 A1 | 7/2008 | Sanford et al. |
| 2008/0266774 A1 | 10/2008 | Tracy et al. |
| 2008/0316116 A1 | 12/2008 | Hobson et al. |
| 2008/0316121 A1 | 12/2008 | Hobson et al. |
| 2009/0015510 A1 | 1/2009 | Nakata et al. |
| 2009/0049773 A1 | 2/2009 | Zadesky et al. |
| 2009/0059485 A1 | 3/2009 | Lynch et al. |
| 2009/0067141 A1 | 3/2009 | Dabov et al. |
| 2009/0155681 A1 | 6/2009 | Lin et al. |
| 2009/0160712 A1 | 6/2009 | Breiter et al. |
| 2009/0185045 A1 | 7/2009 | Rosenblatt |
| 2009/0201652 A1 | 8/2009 | Chew et al. |
| 2009/0245564 A1 | 10/2009 | Mittleman et al. |
| 2009/0257189 A1 | 10/2009 | Wang et al. |
| 2009/0257613 A1 | 10/2009 | Khamashta et al. |
| 2009/0302804 A1 | 12/2009 | Park et al. |
| 2010/0008040 A1 | 1/2010 | Weber et al. |
| 2010/0073247 A1 | 3/2010 | Arkko et al. |

FOREIGN PATENT DOCUMENTS

| | | |
|---|---|---|
| CN | 2779773 | 5/2006 |
| CN | 1870676 | 11/2006 |
| DE | 10252308 | 4/2004 |
| EP | 0534 290 | 3/1993 |
| EP | 1209880 | 5/2002 |
| EP | 1257147 | 11/2002 |
| EP | 1441489 | 7/2004 |
| EP | 1 732 230 A2 | 12/2006 |
| EP | 1870956 | 12/2007 |
| EP | 2343872 | 7/2011 |
| GB | 2137425 | 10/1984 |
| JP | 2003-111194 | 4/2003 |
| JP | 2004-213498 | 7/2004 |
| JP | 2005130156 A | 5/2005 |
| KR | 20070047650 A | 5/2007 |
| WO | WO 2008/152438 | 12/2008 |
| WO | WO 2009/056143 | 5/2009 |

OTHER PUBLICATIONS

Office Action dated Oct. 25, 2010 in CN Application No. 201020179389.8.
Notice of Allowance dated Sep. 3, 2010 in U.S. Appl. No. 12/205,826.
Office Action dated Jul. 12, 2010 in U.S. Appl. No. 12/205,826.
Ho et al., "Cost Effective Integrated Housing and Printed Circuit Module for Battery Pack," ip.com Prior Art Database, Apr. 29, 2004, 6 pgs.
U.S. Appl. No. 12/859,702, filed Aug. 19, 2010.
U.S. Appl. No. 12/859,711, filed Aug. 19, 2010.
U.S. Appl. No. 12/859,701, filed Aug. 19, 2010.
U.S. Appl. No. 12/859,712, filed Aug. 19, 2010.
U.S. Appl. No. 61/377,866, filed Aug. 27, 2010.
Office Action dated Sep. 30, 2009 in U.S. Appl. No. 12/205,824.
Notice of Allowance dated Dec. 21, 2009 in U.S. Appl. No. 12/205,824.
U.S. Appl. No. 12/950,793, filed Nov. 19, 2010.
Office Action dated Sep. 12, 2011 issued in Canadian Patent Application No. 2,735,999.
Office Action dated Sep. 9, 2011 issued in Japanese Patent Application No. 2011-526076.
Examiner's First Report dated Aug. 25, 2011 issued in Australian Patent Application No. 2011203145.
"[Comparison] Mounted parts inherited, while an arrangement inside is boldly changed," NE: Nikkei Electronics, Japan, Nikkei BP, published on Aug. 11, 2008, No. pp. 54-57.
"iPod touch hardware review," PC Watch [online], URL http://pc.watch.impress.com.jp/docs/2007/1010/apple.htm, published Oct. 10, 2007.
Tomohisa Takei et al., "Complete analysis of iPhone," NE: Nikkei Electronics, Japan, Nikkei BP, published on Jul. 16, 2007, pp. 81-88.
Office Action dated Feb. 16, 2011, in CN Utility Model Application No. 201020179389.8.
International Search Report dated Dec. 27, 2010 in PCT Application No. PCT/US2009/050879.
International Search Report dated Jan. 31, 2012 in PCT/US2011/048404.
Written Opinion dated Dec. 27, 2010 in PCT Application No. PCT/US2009/050879.
European Office Action dated Dec. 21, 2011 for EP Patent Application No. 09790546.7.
Office Action dated Jan. 5, 2012 in U.S. Appl. No. 12/712,900.
Written Opinion dated Feb. 13, 2012 in PCT Application No. PCT/US2011/048404.
Notice of Allowance for U.S. Appl. No. 12/712,900 dated Apr. 25, 2012.
International Preliminary Report on Patentability dated Mar. 8, 2011, in PCT Application No. PCT/US2009/080879.
International Partial Search Report in PCT/US2011/048404 dated Feb. 13, 2012.
Korean Office Action KR 10-2011-7021855 dated Feb. 6, 2012.

* cited by examiner

COMPACT FOLDED CONFIGURATION FOR INTEGRATED CIRCUIT PACKAGING

BACKGROUND

1. Field of the Invention

The invention relates to packaging design for consumer electronic devices and more particularly, methods and apparatus for providing packaging and RF shielding configurations for memory chips used in consumer electronic devices.

2. Description of the Related Art

In recent years, portable computing devices such as laptops, PDAs, media players, cellular phones, etc., have become small, light and powerful. One factor contributing to this reduction in size can be attributed to the manufacturer's ability to fabricate various components of these devices in smaller and smaller sizes while in most cases increasing the power and or operating speed of such components. Another factor contributing to the reduction in size is that from a visual stand point, users often find compact and sleek designs of consumer electronic devices more aesthetically appealing and thus, demand compact and sleek designs. The trend of smaller, lighter, more compact and powerful presents continuing challenges in the design portable computing devices and its associated components.

One design discipline that enables small and compact devices is the area internal packaging. A particular device will have a desired form factor and functionality. The desired form factor determines a size of the housing in which all of the device components that provide the desired functionality are packaged. The internal packing design involves minimizing any unused dead-space that does not contribute in some way to the functioning of the device while still fitting the needed components in an allotted space dictated by the form factor. Extra space resulting from an efficient packaging design can be used to enable other design goals, such as 1) making the enclosure thinner, 2) making the enclosure or other components stronger and more shock resistant, 3) improving device performance, such as increasing a battery size which can lead to an improved device performance or 4) addressing RF shielding or other antenna related issues.

One approach that can aid in the packaging design of a compact computing device and help to meet design goals, such as achieving an enclosure of a specified thickness, is to design multi-purpose components. As an example, in the design of a portable computing device, a first component can be dedicated towards achieving a first design goal, such as electrically connecting two components, while a second component can be dedicated towards achieving a second design goal, such as shielding an antenna from extraneous radio frequency (RF) signals. Designed independently, the first component and the second component will each be associated with structure that allows the respective component to perform its intended function. The structure associated with each component will occupy space in the compact computing devices' enclosure.

In some instances, it may be possible to design the first component and the second component interdependently such that a single component is designed that maintains the functions of the first component and the second component while using less structure than when the components are designed independently. For instance, an electrically conducting and RF shielding component can be designed. In view of the above, it is desired to provide designs for multi-purpose components usable in a compact computing device that utilize less structure and take up less space in an enclosure than when the multiple purposes are provided using separately designed components.

SUMMARY

Broadly speaking, the embodiments disclosed herein describe memory chip packaging designs well suited for use in consumer electronic devices, such as laptops, cellphones, netbook computers, portable media players and tablet computers. In particular, packaging designs for memory chips used in a light-weight consumer electronic device with a thin and compact enclosure are described. The packaging designs using memory chips can be referred to as a "foldable memory device" in the associated description. The foldable memory device design can address assembly, electrical connectivity and RF shielding issues associated with using multiple chips in an electronic device. Methods and apparatus for implementing these chip packaging designs are described as follows.

In one embodiment of the chip packaging designs described herein, a plurality of chips can be coupled to a flexible circuit connector to form a memory device. The flexible circuit connector can include data and power traces used by the chips. Two chips on the flexible circuit connector that are adjacent to one another can be separated by a portion of the flexible circuit connector of some length. When the memory device is installed in an electronic device, the portion of the flexible circuit connector between each of the chips can be bent or twisted to allow an orientation of the chips relative to one another to be changed.

Via bending and twisting of the flexible circuit connector between the chips, the memory device can be configured in multiple orientations during the installation process. For instance, during one step of an installation process, a first chip connected to the flexible circuit connector can be in a side by side orientation with a second chip. This orientation can be used while the second chip is attached to a component, such as a printed circuit board (PCB). Then, during a second step, a portion of the flexible circuit connector between the first and second chips can be folded over to allow the orientation between the first chip and the second chip to be changed. For instance, after the folding, the first chip and the second chip can be aligned in a stacked configuration and bonded together. In general, when the memory device includes more than two chips, the orientation of each of the chips relative to one another can be adjusted by bending or folding the flexible circuit connector at different locations through multiple steps until the chips are assembled in a final packaging configuration.

In particular embodiments, the flexible circuit connector can include metal connector pads for grounding the flexible circuit connector to a metal frame or other metal components. To facilitate grounding, the flexible circuit connector can be folded in areas adjacent to the connector pads to allow the connector pads to be bonded to a particular surface, such as a surface of the metal frame. When properly grounded, the flexible circuit connector can be used to form part of a faraday cage.

In one embodiment, the faraday cage can be used to block radio frequency (RF) signals generated by the chips from reaching an antenna installed in the portable computing device. The antenna can be a component of a wireless interface used on the device. Using the flexible circuit connector to form part of the faraday cage rather than a separate metal shield can result in a thinner and lighter weight design since the flexible circuit connector is thinner and weighs less than a typical metal component used for RF shielding. For example, stainless steel is typically used to form a faraday cage used in RF shielding. A flexible circuit connector can be about ⅙ the thickness of a stainless steel component used in this manner.

In a particular embodiment, a method of installing the memory chips attached to the flexible circuit connector in a portable computing device is described. The method can include 1) attaching a first chip to a second chip via a flexible circuit connector; 2) attaching the first chip to a printed circuit board where the first chip can be positioned within a metal frame coupled to the printed circuit board such that the metal frame partially surrounds the first chip; 3) folding over the flexible circuit connector and aligning the second chip with the first chip; 4) attaching the second chip to the first chip via an adhesive where the first and second chips are aligned and bonded in a stacked configuration; 5) grounding a portion of the flexible circuit connector to one or more sides of the metal frame to prevent RF signals from leaking from the first chip and the second chip (as described above, leaking RF signals can affect an antenna used with the portable computing device); and 6) installing an assembly including the first chip, the second chip, the metal frame and the printed circuit board into the portable computing device.

Other aspects and advantages will become apparent from the following detailed description taken in conjunction with the accompanying drawings which illustrate, by way of example, the principles of the invention.

BRIEF DESCRIPTION OF THE DRAWINGS

The described embodiments will be readily understood by the following detailed description in conjunction with the accompanying drawings, wherein like reference numerals designate like structural elements, and in which.

DETAILED DESCRIPTION OF THE DESCRIBED EMBODIMENTS

In the following detailed description, numerous specific details are set forth to provide a thorough understanding of the concepts underlying the described embodiments. It will be apparent, however, to one skilled in the art that the described embodiments can be practiced without some or all of these specific details. In other instances, well known process steps have not been described in detail in order to avoid unnecessarily obscuring the underlying concepts.

Broadly speaking, the embodiments disclosed herein relate to compact form factor integrated circuit packaging designs well suited for use in portable computing devices. For the remainder of this discussion and without loss of generality, the integrated circuits will be discussed in terms of memory devices such as FLASH memory devices, In particular, the FLASH memory devices can take the form of NAND type memory devices widely used in portable computing devices. The packaging designs take into consideration factors such as an ability to use multiple memory chips, an ease of the assembly process and RF shielding.

Flash memory chips, such as chips, are commonly used in portable computing devices. On these devices, it desirable to provide a large amount of reliable memory at a low cost. For cost, availability and/or reliability reasons, it can be sometimes advantageous to use multiple lower capacity memory chips, which can be cheaper, found in greater quantities and more reliable than a single higher capacity memory chip.

One disadvantage of using a greater number of memory chips as opposed to a lower number of memory chips to provide a memory unit, such as two memory chips instead of a single memory chip, can be that the packaging volume is increased when a greater number of memory chips is used. The packaging volume can be increased because each memory chip is packaged separately. Further, additional connectors can be required, which can also increase the packaging volume of the memory unit. Another disadvantage of using a greater number of memory chips as opposed to a lower number of memory chips can be an increase in manufacturing complexity. Additional memory chips can require additional assembly steps, such as additional connection steps, that can complicate the assembly process.

In the following figures, a packaging design for utilizing multiple memory chips is described that can overcome the disadvantages described in the preceding paragraphs. The packaging design can be referred to as a "foldable memory device." The packaging design allows a memory device including a number of memory chips connected by a flexible circuit connector to be simply installed in a portable computing device. The flexible circuit connector can be used to provide data and/or power connections for the memory device and for RF shielding purposes. Using the flexible circuit connector for RF shielding in lieu of a separate metal shield helps to reduce the over thickness profile of the memory unit and can also simplify the assembly process because a need to install a separate metal RF shield can be eliminated.

These and other embodiments are discussed below with reference to FIGS. 1-8C. Nevertheless, those skilled in the art will readily appreciate that the detailed description given herein with respect to these figures is for explanatory purposes only and should not be construed as limiting. In particular, with respect to FIGS. 1A-1C, a foldable memory device and its associated components in two different pre-assembled configurations is described. Then, a foldable memory device in its final assembled and installed configuration is discussed in regards to FIGS. 2 and 3. With respect to FIGS. 4 and 6, foldable memory device configurations are described that can occur during the assembly process prior to a final configuration of the foldable memory device being reached. The different foldable memory device configurations can be obtained by folding or bending the flexible circuit connector portion of the foldable memory device at different locations.

With respect to FIGS. 5A-5D, different methods of grounding the flexible circuit connector portion of the foldable memory device are described. The flexible circuit connector can be grounded to allow it to be used as part of a faraday cage surrounding the foldable memory device. A method of assembling a portable computing device including a foldable memory device is described with respect to FIG. 7. Perspective views of a portable electronic device that can include a foldable memory device are described with respect to FIGS. 8A-8B. Finally, a block diagram of a portable media device that can include a foldable memory device is discussed with respect to FIG. 8C.

Figures 1A, 1B, 1C:
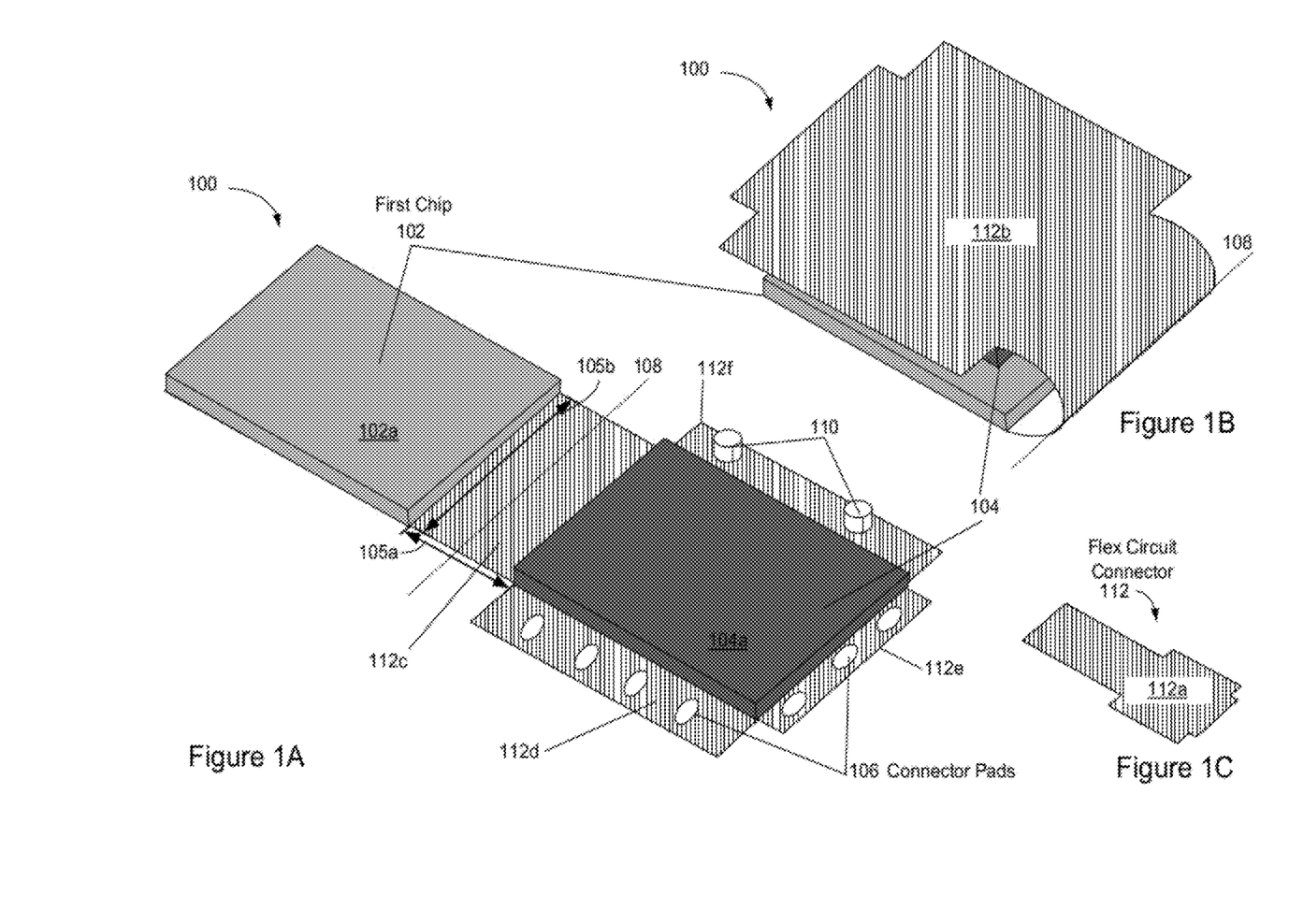
FIG. 1A is a perspective drawing of a foldable memory device in a first pre-assembled configuration in accordance with the described embodiments.
FIG. 1B is a perspective drawing of a foldable memory device in a second pre-assembled configuration in accordance with the described embodiments.
FIG. 1C is a perspective drawing of a flexible circuit connector for a foldable memory device in accordance with the described embodiments.

FIG. 1A is a perspective drawing of a foldable memory device 100 in a first pre-assembled configuration in accordance with the described embodiments. When installed, the foldable memory device 100 can be used as part of a memory unit for a portable computing device. A foldable memory device, such as 100, can include two or more memory chips. The memory chips can be attached to flexible circuit connector, such as 112. In one embodiment, the memory chips can be flash memory nand chips.

In FIG. 1A, two chips, 102 and 104, are shown attached to a top surface 112a of the flexible circuit connector 112. In FIG. 1C, the top surface 112a of the flexible circuit connector 112 is shown without the two chips attached. The flexible circuit connector 112 (also referred to as a "flex connector") can include traces that bring power to each of the chips, such as 102 and 104 and allow data communications between the chips and other devices, such as a main logic board.

In one embodiment, the flex connector 112 can include components, such as 110, that extend from the top surface 112a. The components 110 are located on a flap portion 112f of the flexible connector. In particular embodiments, the components 110 can be part of a data interface that allows communication between the flex connector and a remote device, such as a main logic board and a power interface that brings power to the flex connector 112.

The chips, such as 102 and 104, can include data and power interfaces that are coupled to data and power interfaces on the flex connector 112. In one embodiment, the data and power interfaces (not shown) can be soldered to the data and power interfaces (not shown) on the flex connector 112. For instance, the flex connector 112 can include on its top surface 112a data and power interfaces to which corresponding interfaces on a bottom surface of chips, such as 102 and 104, can be soldered. In addition to soldering, other bonding mechanisms can be used to attach the chips to the top surface 112a of the flex connector 112. For instance, a liquid adhesive or an adhesive tape can be used to further attach each of the chips 102 and 104 to the flex connector 112.

The flex 112 can also include a number of shielding traces that allows the flex to act as a part of a faraday cage. The shielding traces can be coupled to connector pads, such as 106. As is described in more detail with respect to FIGS. 3, 4 and 5A-5C, the connector pads can be coupled, such as taped or soldered, to other conductive components to form a faraday cage that surrounds the chips when they are installed in the portable computing device. The faraday cage can prevent RF signals generated from the chips from interfering with other components of the portable computing device. For instance, the portable computing can include an antenna and the faraday cage can prevent RF signals generated by the chips from reaching the antenna.

The chips, such as 102 and 104, can be attached to the flex connector 112 such that they separated by some length of flex connector, such as 112c. The portion of the flex connector between two chips can be referred to as a "separating portion." The separating portion 112c can be bent and/or twisted in different directions during the installation of the foldable memory device to enable one or more different configuration of the foldable memory device. For instance, the separating portion 112c can be bent and/or twisted in one manner when the first chip is attached to a printed circuit board during a first installation step and then can be bent and/or twisted in a different manner when the top surface 102a is bonded to the top surface of 104a during a second installation step.

Figure 3:
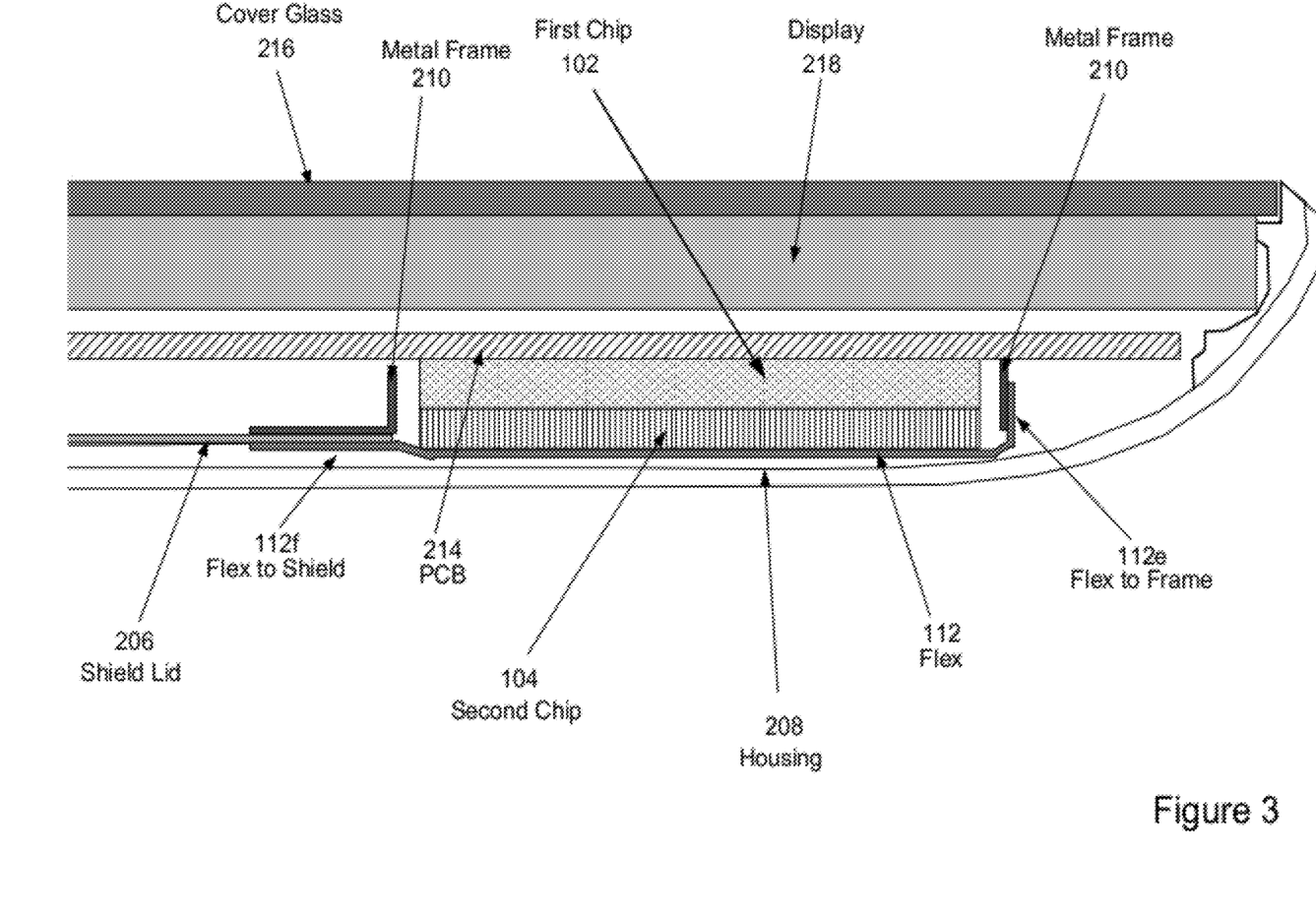
FIG. 3 shows a cross section of a portable computing device including a foldable memory device in accordance with the described embodiments.
Figure 4:
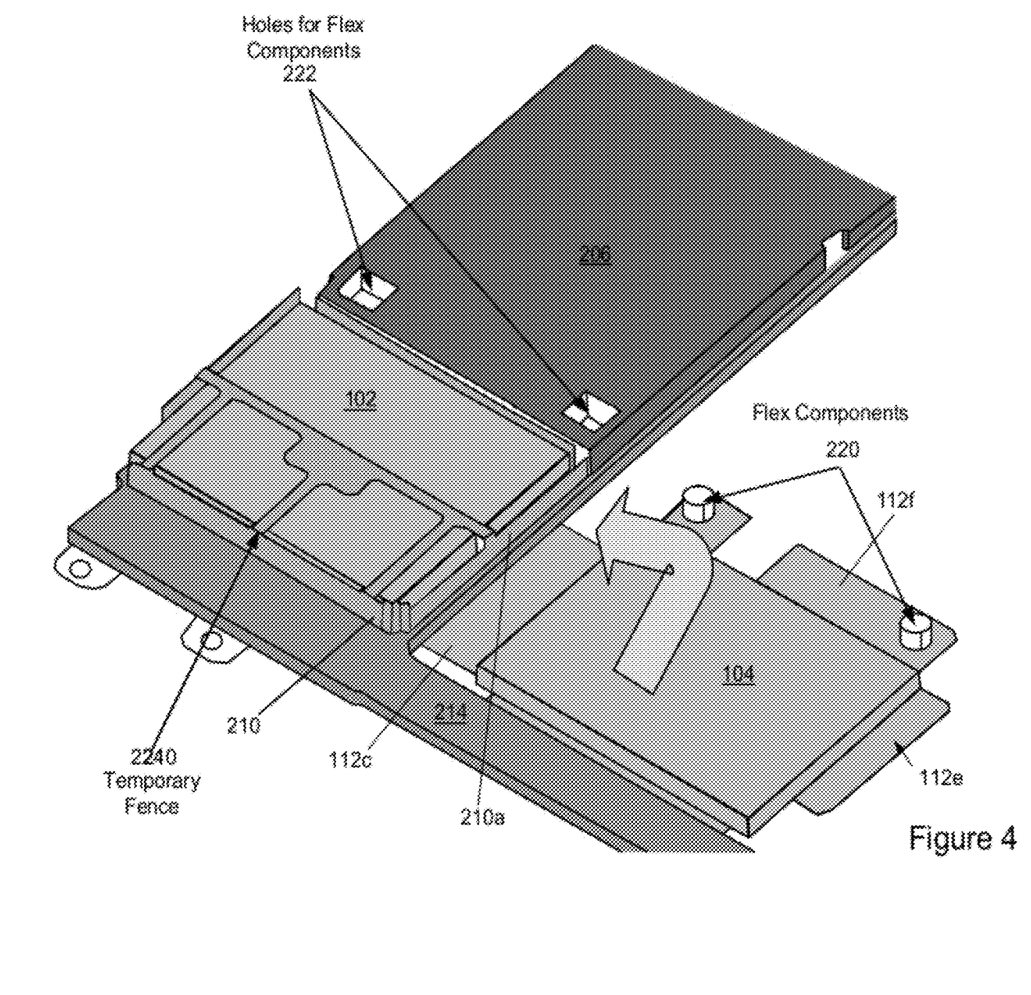
FIG. 4 shows a top view of a foldable memory device coupled to a printed circuit board (PCB) in a pre-assembled configuration in accordance with the described embodiments.

The distance 105a between the chips can be selected to allow the flex connector to be wrapped around various components and/or to conform to different surfaces. For instance, as is shown in FIGS. 3 and 4, the separating portion 112c of the flex connector 112 can be wrapped around a PCB board and a metal frame. In various embodiments, the distance 105a can be adjusted to account for discontinuities in the surface that it is wrapped around, such as a component sticking out from the surface. For instance, as is shown in FIG. 4, the PCB board is at a different height relative to the metal frame. If desired, the separating portion 112c can be bonded in some manner to the intervening surfaces such that it conforms to these surfaces. Whether or not, the separating portion is to conform to the intervening surfaces and a topology of the intervening surfaces can affect the distance 105a between the chips selected for use in a particular foldable memory device design.

A width 105b of the separating portion 112c is shown as approximately the width of the chips, 102 and 104. In various embodiments, the width 105b can be greater or less than the width of the chips. For instance, in one embodiment, the width 105b of the separating portion 112c between the chips can be narrowed to allow the separating portion to be more easily twisted or bent. In another embodiment, one or more apertures can be placed in the separating portion 112c. When wrapped around an intervening surface, an aperture can allow a component extending from the intervening surface to extend through the aperture as opposed to having the separating component go over the extended component. Designed in this manner, the separating portion 112c can conform better to the surfaces surrounding the extended component.

In one embodiment, the separating portion 112c on the flex connector 112 between the chips 102 and 104 can be folded, such as along line 108, to allow the top surface 102a of chip 102 to be aligned and bonded to a top surface 104a of chip 104. In FIG. 1B, a perspective drawing of the flex connector 112 including the chips, 102 and 104, after a folding is shown. In FIG. 1B, the flex connector 112 is folded over along line 108 to reveal a bottom surface 112b of the flex connector 112. In a particular embodiment, the first and second chips can be the same size and the two chips can be aligned directly on top of one another in a stacked configuration such that corners of each chip are proximately aligned. If desired, the two chips can be bonded together in this configuration. In FIG. 1B, the chips are shown in a configuration where they are not yet directly aligned and additional alignment is needed to directly align the chips.

In other embodiments, the flex connector can be folded and the chips can be aligned and bonded in an overlapping stacked configuration where the chips are not directly on top over one another. In this configuration, a portion of the top surface 104a of chip 104 can hang over the edge of the top surface 102a of chip 102. In other embodiments, the chips, 102 and 104, can be of different sizes. In this embodiment, after folding, the chips can be stacked and aligned such that the smaller chip is centered on the larger chip. An off-center stacked alignment configuration can also be employed. For instance, one or more outer edges of the smaller chip can be aligned with one or more outer edges of the larger chip.

Figure 2:
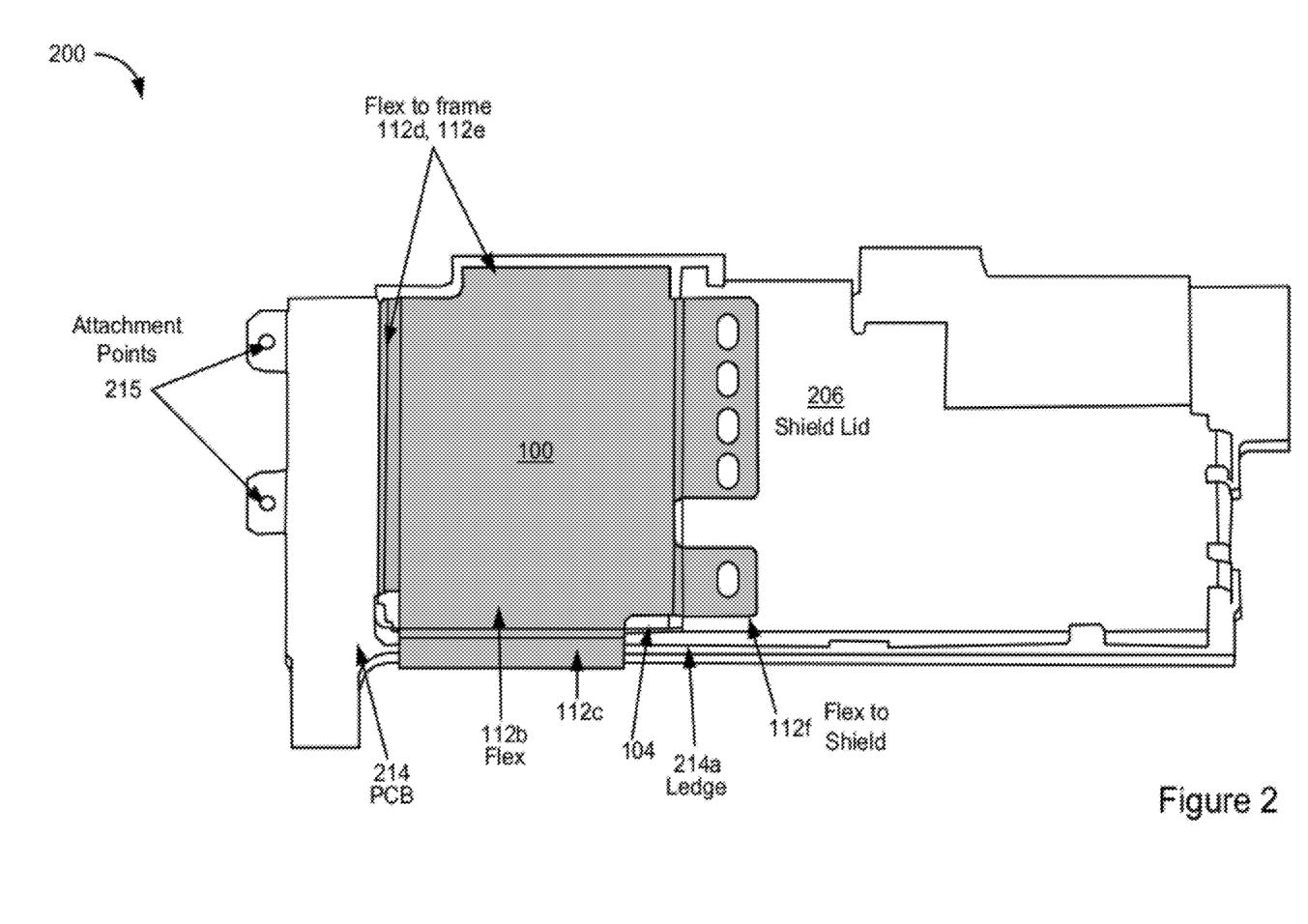
FIG. 2 shows a top view of a foldable memory device coupled to a printed circuit board (PCB) in an assembled configuration in accordance with the described embodiments.

FIG. 2 shows a top view of a foldable memory device 100 coupled to a printed circuit board (PCB) 214 in an assembled configuration in accordance with the described embodiments. The foldable memory device 100 can be a component of assembly 200. The assembly 200 can include the PCB 214 and a number of other components, such as a main logic board that can be located below the shield lid 206. The assembly 200 can be attached to an enclosure of a portable computing device via a number of different attachment points, such as attachment points 215.

When folder over, the flap portion 112f of the foldable memory device 100 can be attached and grounded to the shield lid 206. Flap portions 112d and 112e of the foldable memory device 100 can include connector pads. These portions can be folded over to allow the connector pads to be grounded to a metal frame (see FIGS. 3 and 4) that surrounds the foldable memory device 100. As described above, when grounded, various portions of the flex connector and other metal components, such as the metal frame and the shield lid 206 can be part of a faraday cage that surrounds the chips.

The separating portion 112c of the flex connector 112 is shown folded in two places. The first fold is proximate to the bottom of the PCB 214. The second fold is proximate to the height of the shield lid 206. The separating portion 112c is not made to conform to the small ledge of the PCB 214 that extends from the metal frame. Thus, there can be a gap between the flex circuit and the metal frame. In other embodiments, the separating 112c can be attached to the ledge so that the separating portion 112 better conforms to this intervening surface.

FIG. 3 shows a cross section of a portable computing device including a foldable memory device. An outer perimeter of the portable computing device can be formed from a cover glass 216 and the housing 208. A display 218 and associated circuitry, such as a display driver, can be located below the cover glass 216. The assembly 200 including the PCB 214 and the foldable memory device 100 can be located below the display circuitry. In one embodiment, the assembly 100 can be installed such that the top of shield lid 206 and a bottom surface 112b of flex connector 112 are each facing an inner surface of the housing 208.

In the installed configuration of the foldable memory device, the first chip 102 and the second chip 104 are shown stacked on top of one another where the first 102 and the second chip 104 are proximately the same size and are aligned right on top of each other. As previously described, the first chip 102 and the second chip 104 can be shifted to the left or the right relative to one another resulting in an overhang if desired.

The flap portion 112f of the flex 112 can be attached to the shield lid 206. The flap portion can include connector pads that are grounded to the shield lid 206. The flap portion 112e can be attached to an outer surface portion of the metal frame 210 to ground the flex to an outer surface of the metal frame 210. In other embodiments, the flap portion 112e of the flex 112 can be attached to an inner surface of the metal frame 210 (see FIG. 5A).

The outer surface of the flex 112 below the stacked chips is shown at a slightly lower height than the shield lid 206 relative to a height above the inner surface of the housing 208. In other embodiments, the height of the stacked chips and the flex can be higher than the height of the shield. Further, the stacked chip configuration can include two or more chips and is not limited to the two chips shown in FIG. 3.

Typically, a shield lid that is used as part of a faraday cage can be formed from an electrically conductive metal, such as stainless steel. A flex connector, such as 112, can be about ⅙ as thick as the shield lid formed from stainless steel. Thus, using a flex connector instead of a metal shield can create additional space that can be used for other purposes in the packaging design. For instance, the additional space can be used to increase a size of the battery that is employed or thicken a structure that is used to increase a stiffness of the device.

FIG. 4 shows a top view of a foldable memory device coupled to a printed circuit board (PCB) 214 in a pre-assembled configuration. In one embodiment of an installation step, the first chip 102 can be placed within the metal frame 210 and coupled to the PCB 214, such as via surface mount adhesion. A temporary fence 224 can be provided to the first chip in place while it is secured to the PCB. While the first chip 102 is being attached to the PCB 214, the separating portion 112c of the foldable memory device 100 can be unfolded and placed to the side such that the foldable memory device is in a relatively flat configuration.

In an embodiment of a second installation step, after the first chip of the foldable memory device 100 is secured to the PCB 214, the separating portion 112c of the foldable memory device 100 can be folded over the intervening surfaces consisting of the side of the PCB 214 and a side of the metal frame 210 such that the chip 104 and its associated portion of the flex connector is flipped over. After being flipped, the flex components 220 on the flap portion 112f can be aligned to fit into each of the apertures 222 in the metal shield lid. In one embodiment, the flex components 220 can be part of the data and power interfaces to the flex connector 112.

The foldable memory device can be configured such that, when the flex components 220 are aligned with the apertures 222, the two chips, 102 and 104, are proximately aligned in a stacked configuration. A bonding agent, such as a double-side tape adhesive or a liquid adhesive, can be applied to secure the two chips in a stacked configuration as previously described with respect to FIGS. 2 and 3. Then, flap portions, such as 112e, which include connector pads, can be grounded to another portion of the faraday cage, such as a side of the metal frame 210. A number of different approaches can be applied to secure the connector pads on the flap portions of the flex 112 to the other portions of the faraday cage. These approaches are described with respect to FIGS. 5A-5C.

Figure 5A:
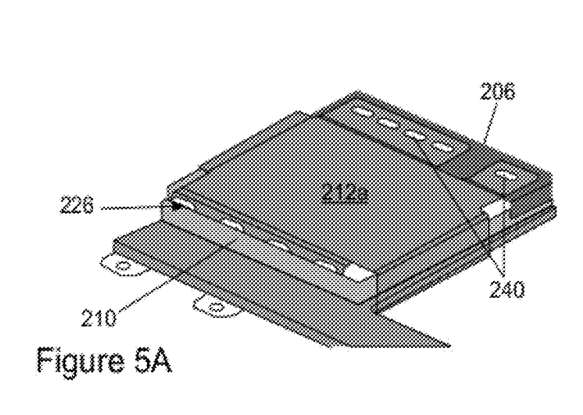
FIGS. 5A-5C show perspective views of a foldable memory device coupled to a PCB and attached to a metal frame using different attachment methods in accordance with the described embodiments.
Figure 5B:
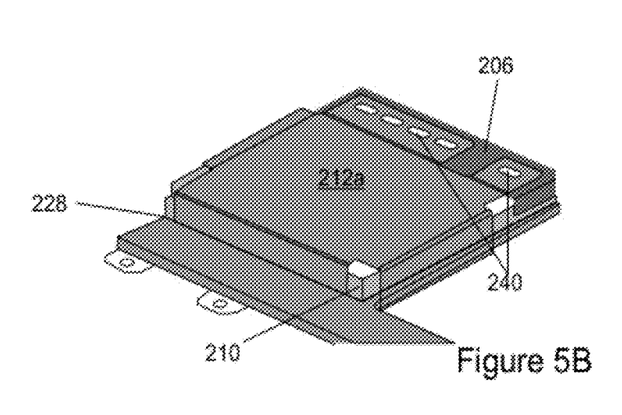
Figure 5C:
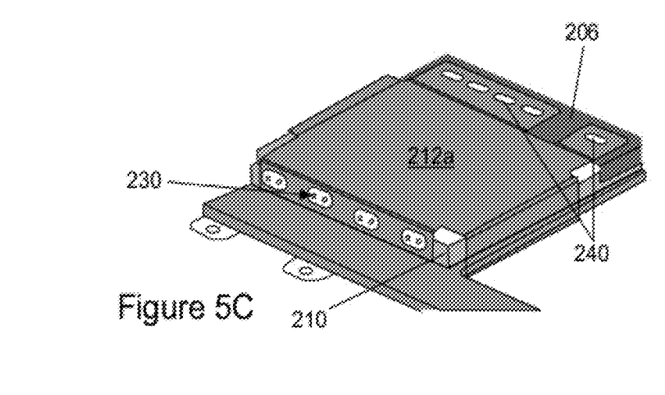

In one embodiment, the chips in the foldable memory device are stacked within a metal frame. In this configuration, connector pads on flap portions of the flex connector are attached to the metal frame to ground the flex connector and form a faraday cage around the chips on the foldable memory device. FIGS. 5A-5C show perspective views of a foldable memory device coupled to a PCB that is attached to a metal frame using different attachment methods in accordance with the described embodiments.

In FIG. 5A, the connector pads, which can be formed from a conductive metal, such as copper, can be tucked on the inside of the metal frame 210. Then, the connector pads can be soldered to the metal frame 210 along a top edge 226. In another embodiment, solder paste can be applied to the connector pads and then the connector pads and the paste can be tucked on the inside of the metal frame. Next, the metal frame can be heated to melt the solder paste and bond the connector pads to the inside of the metal frame 210. The solder paste can also be placed between the inside of the metal frame and connector pads after the flap portion of the foldable memory device including the connector pads has been tucked inside the metal frame.

In a particular embodiment, as is illustrated in FIG. 5B, the flap portion 228 of the foldable memory device can be folded over the outside of the metal frame where a conductive adhesive, such as a conductive adhesive tape, is applied to bond the connector pads to the outside of the metal frame. Pressure can be applied to the flap portion 228 to ensure a bond is formed. In yet another embodiment, as is shown in FIG. 5C, solder paste can be applied between the connector pads and the outside of the metal frame and the connector pads 228 and heat can be applied to solder the connector pads to the metal frame.

A foldable memory device can include multiple flap portions including metal connector pads. In some embodiments, one flap can be tucked inside a metal component, such as a metal frame, and bonded to the inside of the metal while another flap can be folded over the outside of a metal component and bonded to an outside of the metal components, such as the top of a shield lid or an outside portion of a metal frame. The connector pads can be located on a top surface or a bottom surface of the flex connector depending on how the flexible connector is folded and according to which surface (e.g., an inside surface or and outside surface) that the connector pads are to be bonded. As described above, the flap portions can be bonded to a surface using a conductive adhesive, such as a conductive tape or solder.

Figure 5D:
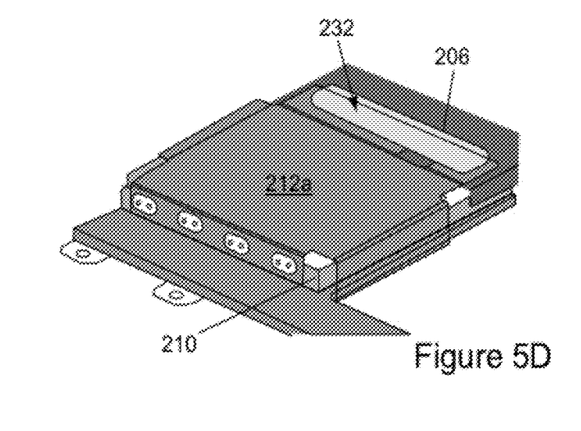
FIG. 5D show perspective views of a foldable memory device coupled to a PCB where contacts associated with the foldable memory device are grounded using a conductive tape in accordance with the described embodiments.

FIG. 5D show perspective views of a foldable memory device coupled to a PCB where contacts (e.g., connector pads 240) associated with the foldable memory device are grounded using a conductive tape 230 in accordance with the described embodiments. In one embodiment, a flap portion, such as 112f, on the flex connector of a foldable memory device can include connector pads 240 on one side and components on the other side (the components 220 are shown in FIG. 4). In the embodiment described in FIG. 4, the foldable memory device is folded over so that the components 220 on flap portion 112f fit through apertures in the shield lid 206. If the flap portion 112f did not include components, then the flap portion could be placed over the top of the shield lid such that it rested on the top of the shield lid. In this embodiment, the connector pads can be placed on the opposite side flex connector such that they face the shield lid 206.

When the flap portion is placed on top of the shield lid, as is shown in FIG. 5A, 5B or 5C, connector pads can be left exposed. As is shown in FIG. 5D, the exposed connector pads 240 can be covered with a conductive tape, such as 230, to ground the exposed connector pads to the another component, such as a top of shield lid 206. The connector pads 240, when grounded in this manner, can allow a portion of the flex connector on the foldable memory device to be used as a portion of a faraday cage.

Figure 6:
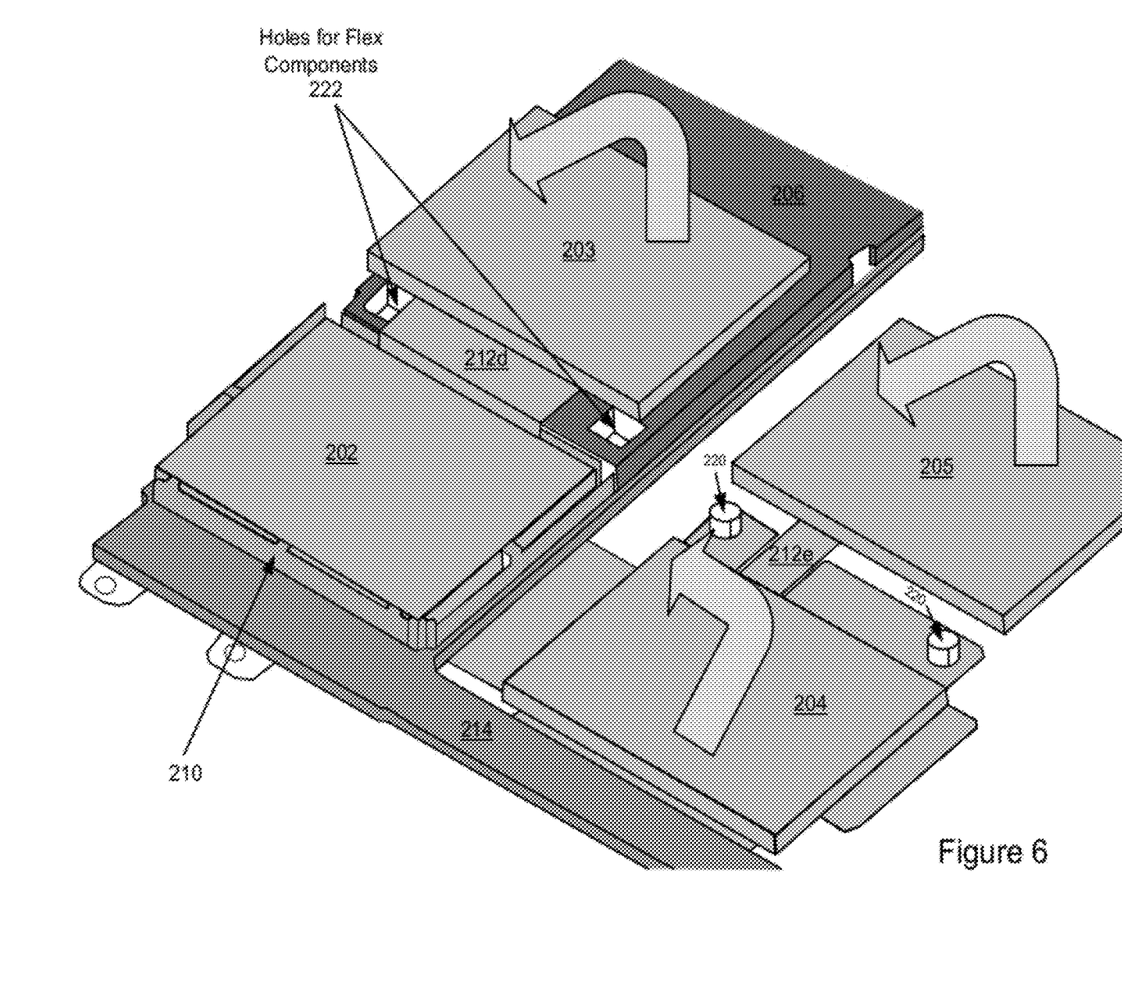
FIG. 6 shows a perspective view of a foldable memory device coupled to a PCB in a pre-assembled configuration accordance with the described embodiments.

FIG. 6 shows a perspective view of a foldable memory device coupled to a PCB in a pre-assembled configuration in accordance with the described embodiments. In this embodiment, the foldable memory device includes four chips, 202, 203, 204 and 205, attached to a flex connector. The chips can be a different size than the previously described chips. For instance, the chip can be thinner, such as about ½ the thickness, of the previously described chips, such that when 202, 203, 204 and 205, are stacked on top of one another, the stack is about the same height as the stack including only chips 102 and 204.

In one embodiment, a first chip in the foldable memory device, such as 202, can be attached to a PCB, such as 214. Then, in one embodiment, a separating portion 212d of the flex connector can be folded over and chip 203 can be bonded to chip 202. Next, separating portion 212e can be folded over and chip 205 can be bonded to chip 204. These steps can also be reversed, i.e., chip 205 can be first bonded to chip 204 and then chip 203 can be bonded to chip 202.

After chips 202/203 and 204/205 are bonded together, a separating 212c portion of the flex connector between chips 202 and 204 can be folded over and the chip stack 204/205 can be bonded to the chip stack 202/203. The components 220 on the flex connector on the bottom of chip 204 can be aligned such that the components fit through the apertures 222. Then, flap portions on the flex connector on the bottom surface of chip 204 can be bonded and grounded to other metal components, such as the metal frame and shield lid to form a faraday cage around the stacked chips, as previously described.

In another embodiment, the folding of the foldable memory device can be carried out in a different order (The folding steps can vary depending on the foldable memory device configuration and these steps are provided for the purposes of illustration only.). For instance, the separating portion 212e of the flex connector can be folder over and chip 205 can be bonded to chip 204. Then, the separating portion 212c can be folded over and chip stack 204/205 can be bonded to chip 202. Then, the separating portion 212d can be folded over and chip 203 can be bonded to the chip stack 202/204/205. In this embodiment, flap portions of the flex connector can be located on the bottom of chip 203 rather than chip 204 as is shown in FIG. 6. The flap portions extending from the bottom of chip 203 can be bonded to other metal components, such as shield lid 206 and metal frame 210, to form a faraday cage around the stacked chips.

The assembly steps described above using a foldable memory device can be implemented in the manufacture of a portable computing device. As an example, a method 300 of assembling a portable computing device including a foldable memory device in accordance with the described embodiments is described with respect to FIG. 7. In 302, a plurality of memory chips, such as chips, can be connected to a flexible circuit connector. The flexible circuit connector can include power and data traces. Each of the chips can be connected to the power and data traces on the flex connector so that power can be supplied to the chips and data can be moved on or off of the chips via the data traces.

Figure 7:
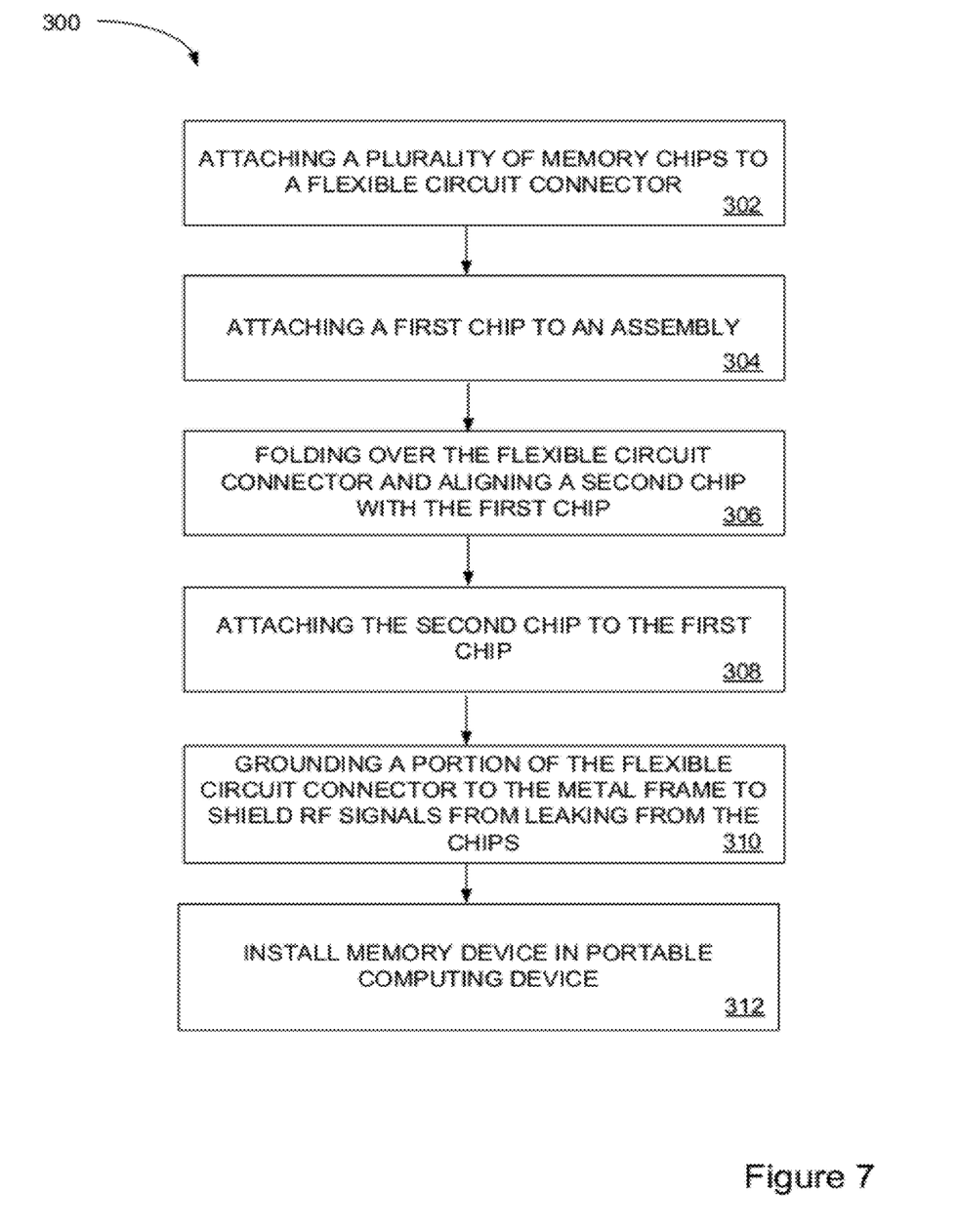
FIG. 7 is a flow chart of a method of assembling a portable computing device including a foldable memory device in accordance with the described embodiments.

The chips can be used as part of a memory device on the portable computing device. In 304, a first chip on the foldable memory device can be attached to an assembly that is to be installed in the portable computing device. For example, the assembly can include a printed circuit board and the first chip can be attached to the printed circuit board. The assembly can be used to secure the foldable memory device in place during operation of the portable computing device. The assembly that holds the foldable memory device can already be secured to the housing of the portable device or can be secured during a later assembly step.

In one embodiment, in 306, a separating portion between two chips can be folded over and the two chips can be aligned in a stacked configuration. In 308, the two chips can be bonded together in the stacked configuration. In general, the folding steps can depend on the number of chips on the foldable memory device and how each chip is connected to one another via the separating portions of the flexible connector. A folding order can be affected by whether a portion of the flexible connector is to be used as part of the faraday cage because the folding order may require that each chip end up in a certain position after the folding takes places so that proper connections used to ground the flex connector can be made.

In 310, connector pads on the flexible circuit connector can be bonded to other metal components to form a part of a faraday cage. For instance, as described above, the connector pads can be bonded to a metal frame that surrounds the chips. The faraday cage can be used to shield RF signals from leaking from the chips. For instance, the portable computing device can include an antenna and the chips can be surrounded by a faraday cage to keep RF signals generated from the chips from reaching the antenna. In 312, when the foldable memory device surrounded by the faraday cage is not part of an assembly that already secured to the housing of the portable computing device, the assembly including the foldable memory device can be installed in the portable computing device.

In the methods described above, one or more of the steps can be implemented by a processor in a computer aided manufacturing process. For instance, a processor can be programmed that allows a robotic device to install and fold the foldable memory device. As another example, a processor can be programmed that allows a robotic device to couple the chips to the flex connector or connector pads on the flex connector to other components.

Figures 8A, 8B:
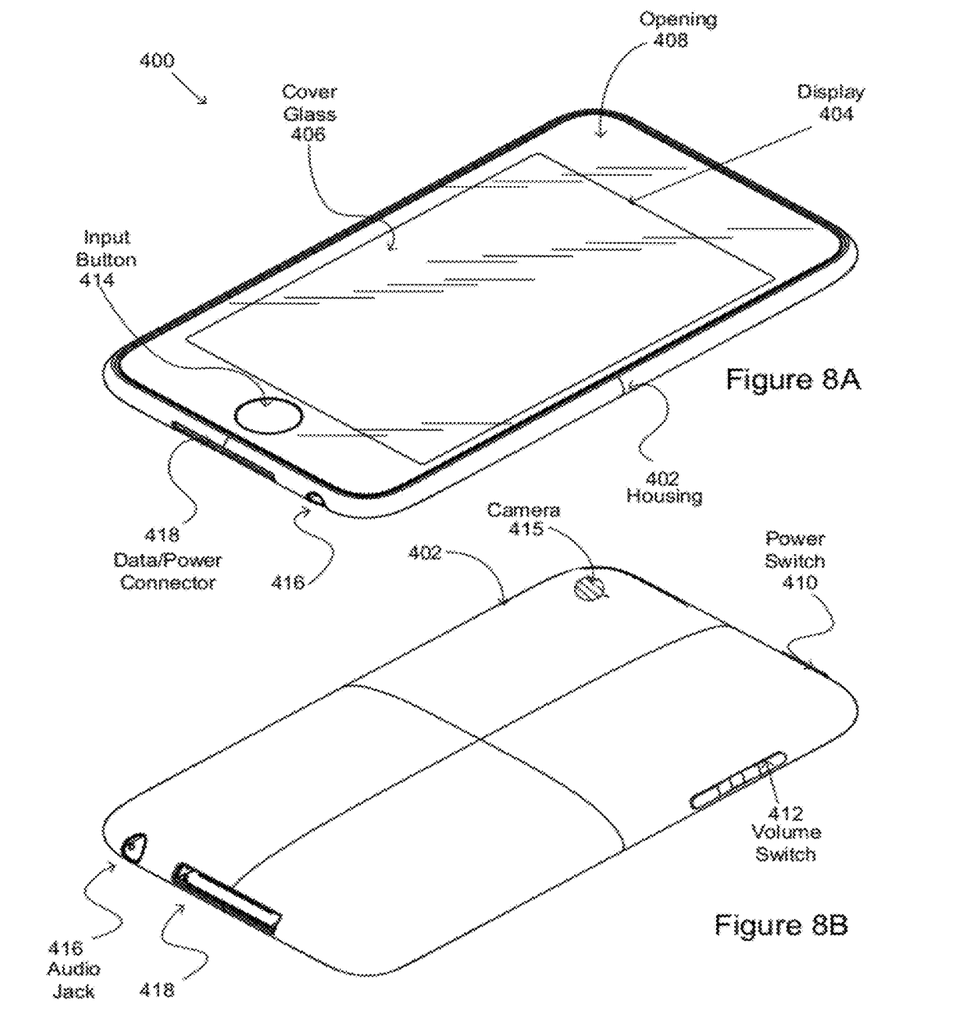
FIG. 8A shows a top view of a portable electronic device in accordance with the described embodiments.
FIG. 8B shows a bottom view of a portable electronic device in accordance with the described embodiments.

FIGS. 8A and 8B show a top and bottom view of a portable computing device 400 in accordance with the described embodiments. The portable computing device can be suitable for being held in hand of a user. A cover glass 406 and a display 404 can be placed within an opening 408 of housing 402. The cover glass can include an opening for an input mechanism, such as input button 414. In one embodiment, the input button 414 can be used to return the portable computing device to a particular state, such as a home state.

Other input/output mechanisms can be arranged around an periphery of the housing 402. For instance, a power switch, such as 410 can be located on a top edge of the housing and a volume switch, such as 412, can be located along one edge of the housing. An audio jack 416 for connecting headphones or another audio device and a data/power connector interface are located on the bottom edge of the housing. The housing 400 also includes an aperture for a camera 415 that allows video data to be received.

Figure 8C:
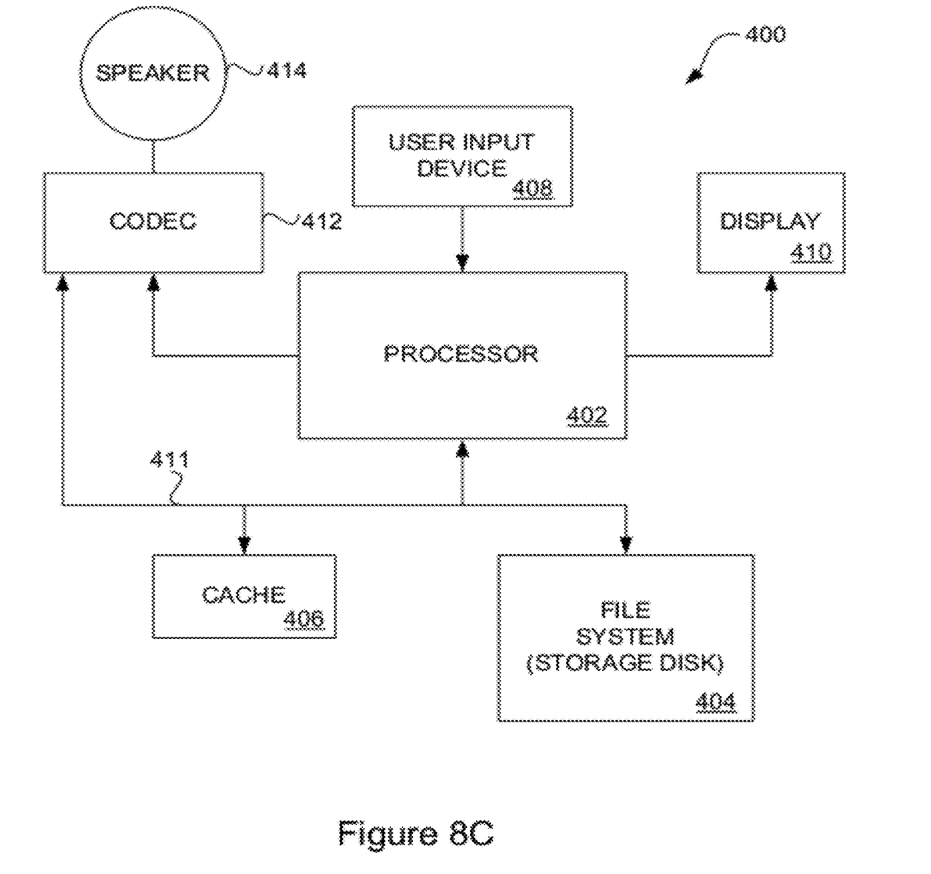
FIG. 8C is a block diagram of a media player in accordance with the described embodiments.

FIG. 8C is a block diagram of a media player 500 in accordance with the described embodiments. The media player 500 includes a processor 502 that pertains to a microprocessor or controller for controlling the overall operation of the media player 500. The media player 500 stores media data pertaining to media items in a file system 504 and a cache 506. The file system 504 is, typically, a storage disk or a plurality of disks. The file system typically provides high capacity storage capability for the media player 500. However, since the access time to the file system 504 is relatively slow, the media player 500 also includes a cache 506. The cache 506 is, for example, Random-Access Memory (RAM) provided by semiconductor memory. The relative access time to the cache 506 is substantially shorter than for the file system 504. However, the cache 506 does not have the large storage capacity of the file system 504.

Further, the file system 504, when active, consumes more power than does the cache 506. The power consumption is particularly important when the media player 400 is a portable media player that is powered by a battery (not shown).

The media player 500 also includes a user input device 408 that allows a user of the media player 500 to interact with the media player 500. For example, the user input device 508 can take a variety of forms, such as a button, keypad, dial, etc. Still further, the media player 400 includes a display 510 (screen display) that can be controlled by the processor 502 to display information to the user. A data bus 111 can facilitate data transfer between at least the file system 504, the cache 506, the processor 502, and the CODEC 512.

In one embodiment, the media player 500 serves to store a plurality of media items (e.g., songs) in the file system 504. When a user desires to have the media player play a particular media item, a list of available media items is displayed on the display 510. Then, using the user input device 508, a user can select one of the available media items. The processor 502, upon receiving a selection of a particular media item, supplies the media data (e.g., audio file) for the particular media item to a coder/decoder (CODEC) 512. The CODEC 512 then produces analog output signals for a speaker 514. The speaker 514 can be a speaker internal to the media player 500 or external to the media player 100. For example, headphones or earphones that connect to the media player 500 would be considered an external speaker.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A device having a memory device, wherein the memory device comprises:
   a first chip coupled to a first portion of flexible circuit connector;
   a second chip including a top surface and a bottom surface, coupled to a second portion of the flexible circuit connector wherein the second portion of the flexible circuit connector proximately covers the bottom surface;
   a third portion of the flexible circuit connector between the first portion and the second portion;
   a fourth portion of the flexible circuit connector extending from the second portion including connector pads coupled to circuit traces within the flexible circuit connector, wherein the top surface of the second chip is bonded to the first chip by folding over the third portion of the flexible circuit connector, wherein the folded third portion of the flexible circuit connector configures the connector pads to ground the fourth portion of the flexible connector to a metal component surrounding the memory device, wherein the flexible circuit connector and the metal component form a faraday cage surrounding the memory device, wherein the connector pads are grounded to the metal component such that the circuit traces-form a part of the faraday cage for preventing the radio frequency signals generated by the first chip and the second chip from leaving the faraday cage.

2. The device of claim 1, wherein the memory device is coupled to a printed circuit board that includes the metal component prior to installation in the device.

3. The device of claim 1, wherein the connector pads are soldered to the metal component.

4. The device of claim 1, wherein the connector pads are bonded to the metal component via a conductive adhesive tape.

5. The device of claim 1, further comprising a fifth portion of the flexible circuit connector, extending from the second portion, including second connector pads, wherein to install the memory device in the computing device the fifth portion is folded over to allow the second connector pads to be coupled the metal component.

6. The device of claim 1, further comprising:
a housing;
an antenna coupled to the housing;
wherein the faraday cage surrounds the first and second chips and prevents radio frequency (RF) signals generated by the first and second chips from reaching the antenna wherein the flexible circuit connector is grounded to the metal frame.

7. The device of claim 1, wherein the metal frame is formed from a silver-nickel alloy.

8. The device of claim 6, further comprising a printed circuit board wherein the second chip is coupled to the printed circuit board.

9. The device of claim 8, wherein the fourth portion of the flexible circuit connector comprises a first component; and
a metal shield coupled to the printed circuit board and proximate to the first chip and the second chip, including an aperture, wherein during assembly of the portable computing device, the third portion of the flexible circuit connector is folded over to allow the first component to fit through the aperture in the metal shield.

10. The device of claim 9, further comprising: conductive tape, wherein the conductive tape is placed over the connector pads and a portion of the metal shield to ground the flexible circuit connector to the metal shield.

11. The device of claim 9, further comprising: a plurality of components coupled to the fourth portion of the flexible circuit connector wherein the third portion is folded over to allow each component to fit through an associated aperture in the metal shield.

12. The device of claim 9, wherein the metal shield and the second portion of the flexible circuit connector are part of the faraday cage for preventing RF signals generated by the first chip and the second chip from leaving the faraday cage.

13. The device of claim 9, wherein the device is a portable computing device.

14. The device of claim 13, wherein the portable computing device comprises:
a cover glass; and
a display that is interposed between the cover glass and the printed circuit board.

* * * * *